United States Patent [19]
Patella et al.

[11] 4,412,143
[45] Oct. 25, 1983

[54] MOS SENSE AMPLIFIER

[75] Inventors: James F. Patella, Centerville; Donald G. Craycraft, Spring Valley, both of Ohio

[73] Assignee: NCR Corporation, Dayton, Ohio

[21] Appl. No.: 247,683

[22] Filed: Mar. 26, 1981

[51] Int. Cl.³ .......................... H03K 5/24; G11C 7/06
[52] U.S. Cl. ................................... 307/530; 307/578; 307/362; 365/205; 365/208
[58] Field of Search ............... 307/355, 362, 530, 578, 307/DIG. 3; 365/205, 207, 208; 377/60

[56] References Cited

U.S. PATENT DOCUMENTS

| | | | |
|---|---|---|---|
| 3,938,109 | 2/1976 | Gionis et al. | 307/530 X |
| 3,979,603 | 9/1976 | Gosney | 307/362 |
| 3,982,140 | 9/1976 | Lockwood | 307/279 |
| 3,983,413 | 9/1976 | Gunsagar et al. | 307/355 |
| 3,992,637 | 11/1976 | Cassidy et al. | 307/530 |
| 4,181,865 | 1/1980 | Kohyama | 307/361 |
| 4,192,014 | 3/1980 | Craycraft | 365/104 |
| 4,195,357 | 3/1980 | Kuo et al. | 307/530 X |
| 4,253,163 | 2/1981 | Komoriya et al. | 307/DIG. 3 X |

FOREIGN PATENT DOCUMENTS 54-124665  9/1979  Japan ................................. 307/530

OTHER PUBLICATIONS

Bishop et al., "High-Speed, High-Sensitivity FET Sense Latch", IBM Tech. Discl. Bull.; vol. 18, No. 4, pp. 1021-1022; 9/75.

Primary Examiner—Larry N. Anagnos
Attorney, Agent, or Firm—J. T. Cavender; Philip A. Dalton; Casimer K. Salys

[57] ABSTRACT

A comparator circuit suitably configured and synchronously operated to distinguish between the levels of two input signals and to provide the relative standing of the levels in binary format. In one form, a symmetrically organized circuit having the fundamental structure of a bistable multivibrator is initially operated in a differential mode and subsequently transitioned to a latch mode. Appropriate constant current source biasing shifts the differential mode operation to optimize amplifier element gain characteristics for the levels of input signals received. The amplified difference between the two input signals is stored within various capacitive elements of the circuit output stages. During the differential mode, the bistable multivibrator cross-coupling elements are disabled. At the termination of the differential mode, the amplified difference between the two input signals provides the initial conditions for the regenerative dynamics associated with the onset of cross-coupling and the transition to the latched state. Preferably, the input signals and the bias circuit are disabled in synchronism with the cross-coupling operation, to provide a stable output from the multivibrator circuit in conventional binary format.

9 Claims, 2 Drawing Figures

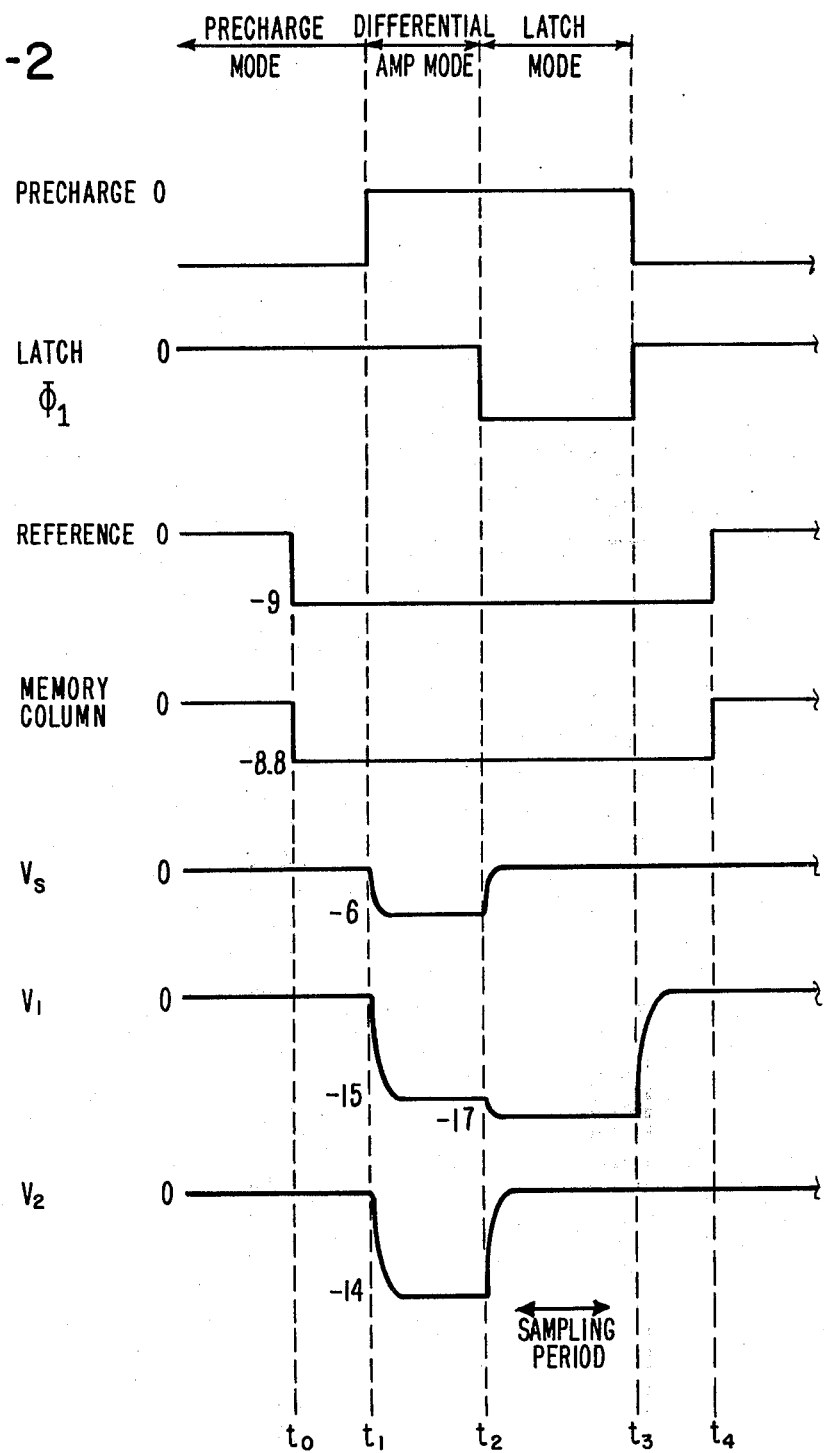

MOS SENSE AMPLIFIER

BRIEF SUMMARY

The present invention relates to an integrated circuit comparator which is suitably configured with metal oxide semiconductor (MOS) type field effect transistors (FETs). Moreover, the invention is operatively characterized by a sequence commencing with a DIFFERENTIAL MODE and followed in time by a LATCH MODE. The output signal during the LATCH MODE is in binary format with the state representing the relative standing of two input signal levels compared during the DIFFERENTIAL MODE. Substantially identical load and amplifier elements in the two conductive paths of the circuit are biased during the DIFFERENTIAL MODE to optimize gain by operating the driver FETs near their threshold voltages. The amplified difference between the two input signals being compared during the DIFFERENTIAL MODE provides the initial conditions on the capacitive elements in the circuit for the succeeding transition to the LATCH MODE. Thereby, the regenerative dynamics associated with the transition to the LATCH MODE consistently latches the circuit into the appropriate binary state. Upon entering the LATCH MODE, the circuit bias and input signals may be decoupled from the comparator circuit.

One embodiment of the comparator circuit comprises a symmetrically arranged bistable multivibrator, cross-coupled through commonly actuated devices suitably operable to disconnect the cross-coupling paths. The amplification devices in the two respective arms of the multivibrator circuit are commonly connected at one end to a constant current source during the DIFFERENTIAL MODE; the source being adjusted to bias the amplification devices into regions of high gain. A shorting device in electrical parallel with the current source, and actuated in synchronism with the devices in the cross-coupling paths, disables the current source during the LATCH MODE.

Preferably, individual decoupling FETs are connected in the path of each input signal to the comparator. The FETs operatively decouple the input signals to the bistable multivibrator when appropriately driven with command signals synchronized to the LATCH MODE. In still another form, the multivibrator inverters contain booted load FETs. The inverter circuits are then precharged before the onset of the DIFFERENTIAL MODE, to ensure proper booting operation and to decrease the settling time attributable to that mode.

The comparator as taught herein is particularly suited for fabrication using integrated circuit technology and insulated gate field effect transistors (IGFETs) as the active elements. As embodied, the DIFFERENTIAL MODE bias circuit shifts the source voltages of the driver FETs into a threshold voltage proximity with the input voltages. Thereby, the highest gain is attained from the differentially operated driver FETs. Precise control of the structural symmetry, in conjunction with the capacitive storage of the amplified differences, ensures that the correct binary state is obtained at the conclusion of the dynamic transition between the DIFFERENTIAL MODE and the LATCH MODE.

DESCRIPTION OF THE DRAWINGS

FIG. 2 illustrates the time-related voltage waveforms at seven locations within the circuit of FIG. 1, given a p-channel implementation of FETs.

DETAILED DESCRIPTION

Figure 1:
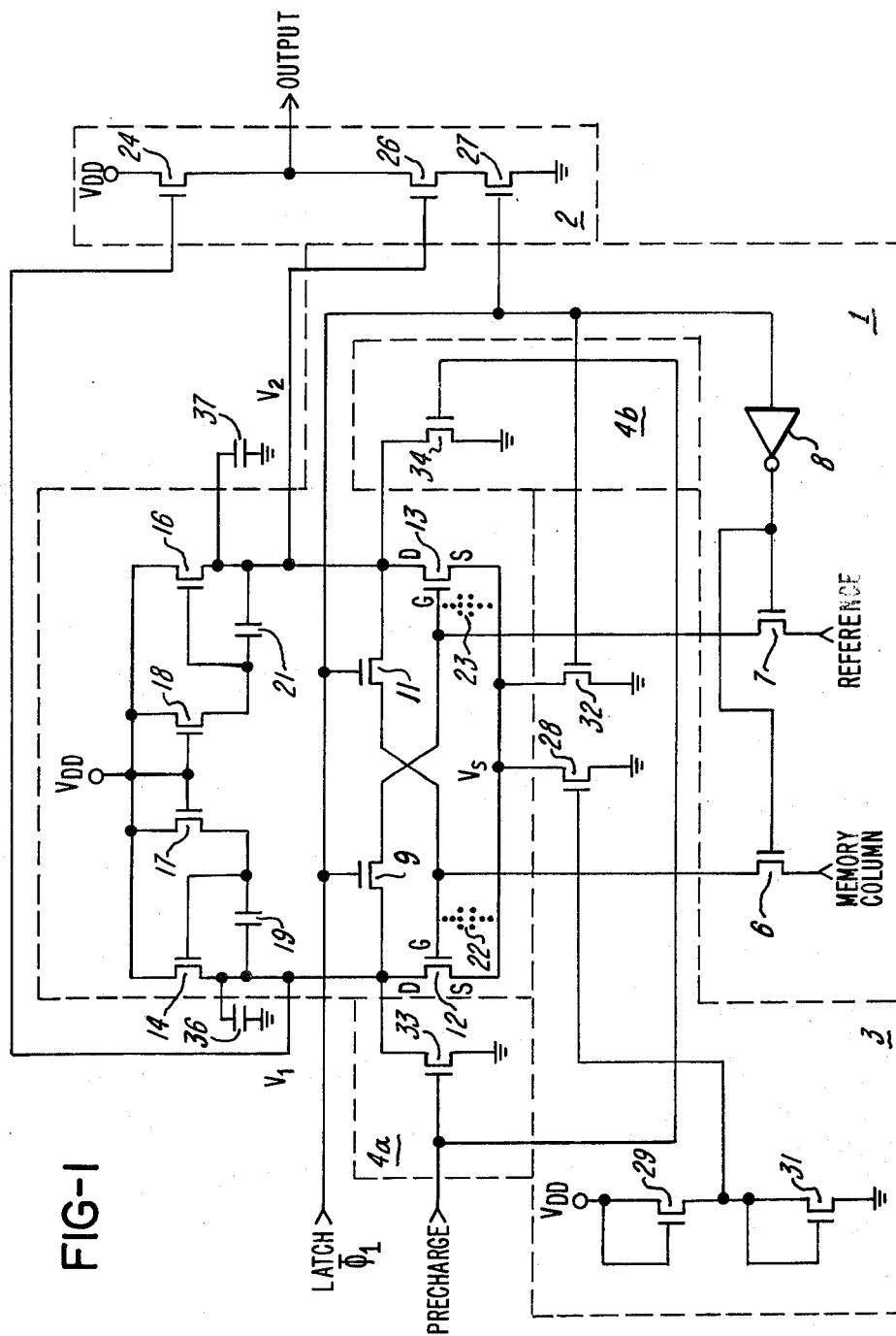
FIG. 1 is a schematic diagram depicting one embodiment of the comparator circuit, taking the form of an MOS type sense amplifier.

Generally recognized techniques of storing data in memory arrays provide for one data bit per memory cell. The information in each cell is detected externally as a voltage having either a zero level or a high level, respectively corresponding to the binary states of 0 and 1. Effects such as time, temperature, and read-write cycling of the memory array, tend to degrade the window between the voltages associated with each of the two binary states. For these and numerous other reasons, little prior effort has been directed toward subdividing the voltage window and thereby increasing the data stored in each cell.

Recently, however, the continued emphasis on greater data storage has led to the development of some novel techniques for increasing the data stored in a given area of memory. A specific example of one approach is described in U.S. Pat. No. 4,192,014, entitled "ROM Memory Cell With $2^n$ FET Channel Widths." The cited patent and the present invention are common as to the assignee. Since the subject matter of that patent provides a succinct description of the manner in which the present invention would be utilized, it is incorporated herein by reference. In one embodiment, the memory system taught therein is configured so that each memory cell stores two binary bits of information, and requires memory output signals at four distinct voltage levels to distinguish therebetween. As described, each of the binary states (00, 01, 10, and 11) corresponds to a substantially equal segment of the voltage window between the outer bounds of ground potential and the power supply.

One of the critical elements in such a memory system is the level detector circuit. Each such circuit must compare the memory voltage read from the array with a segmented level of the operating window to determine which is greater. Furthermore, since speed is an important consideration in obtaining data from large memory arrays, the comparator circuits, otherwise known as sense amplifiers, must have a short settling time. Specifically, distinguishing between voltages in the manner suggested does not appear particularly onerous. However, the difficulties begin to take form when one recognizes some fundamental constraints. For instance, since the output data must be binary in form, each sense amplifier circuit must latch or otherwise select either extreme of the two binary format output states. Furthermore, the sense amplifier must exhibit adequate differential gain to distinguish relatively small voltage differences between two relatively large voltages. No less important is the pursuit of good common mode rejection and fabrication with minimum device count or chip area.

For instance, to optimize the speed and gain characteristics of such sense amplifiers, one would normally prefer to operate the input stage field effect transistors so that the gate-to-source voltages are at or very near the threshold level of the transistor. However, the two-bit-per-cell concept requires three sense amplifier circuits, each operating at substantially different levels over the range between ground potential and the supply voltage. Consequently, the voltages provided to the input stage field effect transistors of at least two sense amplifiers will not be near their threshold voltages. Selective alteration of transistor threshold voltages during integrated circuit fabrication is not an economically practical solution.

Consider another constraint. The ideal sense amplifier would accomplish the above-noted objectives in a single amplification stage. Generally, it is readily feasible to obtain the gain and binary output objectives sought herein by using two cascaded differential amplifiers, with the first serving as a level shifter preamplifier and the second producing an acceptable binary output state. However, the chip area consumed by such duplication of amplifier stages detracts from the remaining objective. Naturally, the potential for increased data storage is not fully realized if the binary data stored per unit cell is doubled, but total cell count is reduced as an offset to the area consumed by large sense amplifier circuits.

The comparator type sense amplifier disclosed herein overcomes the noted problems while retaining excellent speed, common mode rejection and gain characteristics. Chip area is minimized and outputs are presented as distinct binary levels. As embodied, the sense amplifier circuit operates in two modes, a DIFFERENTIAL MODE for high gain comparison and a LATCH MODE for a stable and fixed binary format output. The transitional dynamics between the DIFFERENTIAL and the LATCH MODES serve to define the latched binary state in direct correspondence to the amplified relative differences obtained during the DIFFERENTIAL MODE. These and other structural and functional features will become apparent from the ensuing description.

As a prelude to describing an embodiment of the invention, attention is directed to the teachings in U.S. Pat. No. 3,982,140, the subject matter of which is incorporated herein by reference. The high-speed bistable multivibrator circuit shown and described in the patent is similar in some respects to the circuit which appears in the present invention. There are, however, significant differences in the fundamental concepts and their implementation. For instance, the bistable multivibrator in the cited patent is by design not intended to compare signal levels over a broad range of voltages. Thus, the circuit taught therein lacks any selective and synchronous biasing to optimize gain and speed. Likewise, in the manner of its practice no DIFFERENTIAL operating mode or transition is contemplated. Booted inverter elements, suitably synchronized to elevate the sense amplifier's operating speed, are also absent. In addition, one undoubtedly recognizes that numerous other distinguishing structural and operational features of the presently disclosed invention are lacking. For purposes of immediate comparison, however, it may be useful to note that the line designated to receive the LATCH commands herein is in limited ways analogous to the $\overline{\phi}$ signal line in the cited patent.

Attention is now directed to FIG. 1 of the drawings, where a representative embodiment of the circuit is schematically depicted. For present purposes, the field effect transistors are p-channel, enhancement mode MOS type integrated circuit devices. The capacitors shown symbolically by way of dotted lines are intrinsic gate-to-source parameters in the immediately adjacent transistors. For purposes of the embodiment, supply voltage $V_{DD}$ is at a nominal level of $-17$ volts.

In the overview, the individual functional groups comprising the overall circuit have been distinguished by dashed lines. Circuit section 1, enclosed within the dashed perimeter line, is very similar to the bistable multivibrator circuit disclosed in the last-noted patent. A push-pull operated output driver circuit, with a series connected disable transistor, is enclosed within circuit section 2. Circuit section 3 contains a constant current source, regulated by a voltage divider and connected in parallel with a disabling transistor. Bifurcated circuit sections 4a and 4b are shown to contain individual precharge transistors.

Commence the analysis of circuit and its operation by considering the circuit in segment 1. The voltage signals on the MEMORY COLUMN line and the REFERENCE line enter the bistable multivibrator whenever the voltage on the commonly connected gate electrodes places respective transistors 6 and 7 into conductive states. The gate signal corresponds to a $\overline{\text{LATCH}}$ command, being merely an inversion by inverter 8 of the signal on the LATCH line. The same LATCH line signal is shown to be connected to the gate terminals of cross-coupling transistors 9 and 11. These transistors cross-couple the drain and gate terminals of driver transistors 12 and 13 in the manner of the cited art. Outputs from circuit section 1 are accessible at node $V_1$, common with the drain terminal of transistor 12, and node $V_2$, common with the drain terminal of transistor 13.

The upper region of circuit section 1 is shown to contain substantially identical booted load circuits, serving as load elements for amplifying driver transistors 12 and 13 in the two symmetrically arranged arms of the multivibrator circuit. With more specificity, the booted load circuits contain substantially identical load transistors 14 and 16 driven by transistors 17 and 18 from common supply voltage $V_{DD}$. The booted load circuits also contain capacitive elements, 19 and 21, between the gate and source terminals of load transistors 14 and 16, respectively. The unique functional contributions of the two booted inverter circuits will become apparent when the multivibrator circuit dynamics are described at a point hereinafter.

The circuit section designated by reference numeral 2 comprises the output coupling stage, including a set of oppositely driven push-pull transistors, 24 and 26, connected in series with the disabling transistor, 27. The purpose of this circuit segment is twofold. First, push-pull transistors 24 and 26 form substantially identical load impedances for multivibrator nodes $V_1$ and $V_2$, decoupling and thereby insuring that the effects of output loads will not alter the circuit dynamics during the transition between DIFFERENTIAL and LATCH MODES of the operating sequence. The remaining transistor, 27, is present to prevent the formation of a short circuit path from $V_{DD}$ to ground through transistors 24 and 26 during the DIFFERENTIAL MODE of the operation. During that mode, the voltages at both nodes, $V_1$ and $V_2$, lie between $V_{DD}$ and ground, effectively placing series connected transistors 24 and 26 into full conduction. Upon entering the LATCH MODE, the node voltages are driven to opposite extremes, placing one of the two push-pull transistors into a nonconducting state and thereby avoiding a short circuit between the power supply and ground.

The circuit segment designated by reference numeral 3 establishes a differential organization of the circuit and biases the voltage appearing at the source terminals of driver transistors 12 and 13. In this way, the voltage levels on the MEMORY COLUMN line and REFERENCE line differ from the biased source voltage $V_S$ in an amount approximating the threshold of the driver transistors. Using FIG. 2 to illustrate, if the REFERENCE voltage is at a level of $-9$ volts, the MEMORY COLUMN voltage is of a similar magnitude, and the threshold voltages of transistors 12 and 13 are approximately $-3$ volts, node $V_S$ will be approximately $-6$ volts during the DIFFERENTIAL MODE of operation. Undoubtedly, one now recognizes that the voltage at node $V_S$ is the greater of two voltage combinations, i.e., the MEMORY COLUMN voltage less the threshold of transistor 12 or the REFERENCE voltage less the threshold of transistor 13. However, care must be exercised during the design of interacting FETs 12, 13, 14, 16 and 28 to insure that voltage on node $V_S$ can reach the levels sought.

The embodying bias circuit is shown to contain transistor 28, connected between node $V_S$ and ground potential, and operated in the manner of a constant current source. Transistors 29 and 32 form a voltage divider which regulates the current flow through transistor 28. Consequently, transistor 28 provides not only a commensurate level of source terminal biasing, but also common mode rejection for the input signals connected to the gate terminals of driver transistors 12 and 13. No less important is the increased differential gain as perceived at nodes $V_1$ and $V_2$.

A disabling transistor, 32, suitably functioning as an electrical short for constant current source transistor 28, is shown connected in electrical parallel with transistor 28. In the depicted embodiment, the gate electrode of transistor 32 is energized by an appropriate signal on the LATCH line. In this way, a LATCH signal shorts the constant current source and allows the output voltages at nodes $V_1$ and $V_2$ to approach the opposite extremes of the voltage supply. The OUTPUT signal during the LATCH MODE follows in ordered sequence, assuming a binary format suitable to prevent the shorting of push-pull output transistors 24 and 26.

Circuit sections 4a and 4b are shown to contain transistors 33 and 34, serving to selectively connect output nodes $V_1$ and $V_2$ with ground potential. When appropriately energized with a signal on the PRECHARGE line, transistors 33 and 34 short nodes $V_1$ and $V_2$ to ground. Booted inverter capacitors 19 and 21 are thereby charged to a voltage approaching the level of $V_{DD}$ minus a FET threshold. The existence of the voltage on capacitors 19 and 21 temporarily increases the gate voltage on transistors 14 and 16 at the onset of the transient period between the DIFFERENTIAL MODE and the LATCH MODE, briefly, but significantly, increasing the current through these transistors. Recognizing that nodes $V_1$ and $V_2$ are capacitively loaded by the various elements attached thereto, it becomes apparent that the transient overdrive of the load transistors is directed toward increasing the circuit's switching speed. Furthermore, the booting action allows for the binary "1" output level of either node $V_1$ or $V_2$ to approach $V_{DD}$ during cyclic operation, instead of the $V_{DD}-V_{threshold}$ that would otherwise be attained.

With an understanding of the constituent circuits at hand, the operation of the composite circuit will be considered next. Generally, it may be said that the regenerative dynamics coupled with the circuit symmetry ensure appropriate latching in the course of the transition from the DIFFERENTIAL MODE to the LATCH MODE. During this transient period, the multivibrator circuit must operate with substantial symmetry if the nominal voltage difference between nodes $V_1$ and $V_2$ is to consistently define the final binary state of the circuit. For this reason, the embodiment in FIG. 1 contains supplemental capacitors 36 and 37, respectively connecting nodes $V_1$ and $V_2$ to ground potential. The two capacitors are substantially identical in size relative to each other, yet significant in comparison to the intrinsic capacitive loads coupled to nodes $V_1$ and $V_2$. Thereby, minor unbalances are effectively suppressed. Furthermore, since the differential voltages are stored on these supplemental capacitors, they also drive the proper selection of binary output state without significantly degrading circuit speed. Undoubtedly, if the impedance loads on nodes $V_1$ and $V_2$ are substantially identical without capacitors 36 and 37, their contribution is superfluous. In similar context, intrinsic gate-to-source capacitors 22 and 23 should also be considered for their influence on the transition dynamics.

With an understanding of the circuit constituents and their interactive functions at hand, it is appropriate to describe the circuit operation with reference to the group of voltage-time plots depicted in FIG. 2. At the outset, it should be noted that the plots depict only that segment of the overall operating period which illustrates the circuit dynamics. The node and line labels correspond to those appearing in FIG. 1. The important time events are shown by dashed lines projecting vertically, with appropriate labels at the top and bottom of the figure. Consistent with the concept that FIG. 2 merely depicts one embodiment of the invention, those skilled in the art will recognize that some of the events are amenable to variations in time without affecting circuit function. Where such permutations of events affect circuit operation, they will be specifically noted. For purposes of illustrating circuit principles, the PRECHARGE, LATCH, REFERENCE and MEMORY COLUMN waveforms are illustrated as being ideal signals.

The PRECHARGE MODE, designated at the top of FIG. 2, corresponds to a period when a precharge command signal energizes transistors 33 and 34 to effect a grounding of nodes $V_1$ and $V_2$. $V_S$ is also brought to ground potential. In the manner described previously, capacitors 19 and 21 are precharged through transistors 17 and 18, with the minimum duration constrained by the component time constants. Note from the voltage plots that during the PRECHARGE MODE, the signal on the LATCH line is zero, disabling the path through transistors 9, 11, 27 and 32, while enabling connection through transistors 6 and 7.

The plots in FIG. 2 show that the REFERENCE line signal attains $-9$ volts and the MEMORY COLUMN line signal attains $-8.8$ volts at time $t_0$. These two signals serve as the inputs to the sense amplifier circuit. Reflecting back upon the description in the last-cited U.S. Patent, the amplitude of the REFERENCE signal corresponds to the voltage level distinguishing between a binary 01 state and a 10 state. From this, the $-8.8$ volts on the MEMORY COLUMN line illustrates memory data corresponding to the binary 01 state. Proceeding with the analysis of FIG. 2, it is apparent that immediately after time $t_0$ the PRECHARGE and LATCH line signals inhibit any circuit reaction to the MEMORY COLUMN and REFERENCE line signals noted. The latter effect shows that the REFERENCE and MEMORY COLUMN signals may, as shown, coincide in time, but are not so constrained. The two signals may also commence individually, at points in time between events $t_1$ and $t_2$ shown in the plots. However, any associated DIFFERENTIAL MODE dynamics must cease before time $t_2$. In like manner, either of the two signals may also terminate at any time after the onset of the LATCH MODE at time $t_2$.

Continuing again with the time analysis of the various signals plotted, it is shown that the PRECHARGE line signal ceases at time $t_1$. Since transistors 9 and 11 in the cross-coupling arms of the multivibrator continue to remain off, the circuit then assumes a differential amplifier mode of operation. Node $V_S$ shifts to approximately $-6$ volt by virtue of the $-9$ volt REFERENCE signal and 3 volt threshold of FET 13 as nodes $V_1$ and $V_2$ fall to $-15$ and $-14$ volts, respectively. The one volt differential between nodes $V_1$ and $V_2$ represents a voltage gain of 5 over the difference of 0.2 volts separating the MEMORY COLUMN voltage (8.8 volts) and the REFERENCE voltage (9 volts). The exponential shape of the voltages on nodes $V_1$ and $V_2$, immediately following time $t_1$, are attributable to the capacitive loads on each of the nodes, and particularly supplemental capacitors 36 and 37.

Time $t_2$ prescribes the entry into the LATCH MODE of the operating sequence. Commencement of the mode is evidenced by the presence of a LATCH line signal, culminating soon thereafter in the latching of the bistable multivibrator into one of two states. Operatively, the onset of the LATCH signal energizes transistors 9, 11, 27 and 32, as it de-energizes data entry transistors 6 and 7. In the embodiment, the voltages at nodes $V_S$ and $V_2$ fall to ground potential as node $V_1$ rises to $V_{DD}$ of the power supply. The push-pull output transistors, 24 and 26, follow in prescribed manner.

The interval between the conclusion of the $t_2$ transient and the onset of time $t_3$, provides a suitable period for sampling the multivibrator output to determine which of the two input signals, REFERENCE or MEMORY COLUMN, were greater in absolute magnitude. In the context of this particular embodiment, $-17$ volts at $V_1$ and an OUTPUT line voltage of $V_{DD}$ indicates that the REFERENCE line signal was greater than the signal on the MEMORY COLUMN line. Therefore, the stored data must be either 00 or 01, depending on the response of the next adjacent sense amplifier in the manner taught by the previously noted U.S. patent. Consistent with the teaching in U.S. Pat. No. 4,192,014, the composite of the three sensor amplifiers is necessary to ascertain the exact binary state in each memory cell.

The dynamics of the circuit at time $t_2$, as well as the initial conditions on the circuit elements immediately preceding time $t_2$ are important in understanding the transition between the DIFFERENTIAL MODE and the LATCH MODE. The dominant operative considerations are symmetry in the circuit and asymmetry in the initial conditions stored on the capacitive elements. Using the embodiment as an example, analysis of the voltage levels at nodes $V_1$ and $V_2$ shows that the capacitively loaded nodes differ by one volt at time $t_2$. The appearance of a LATCH line signal at that time simultaneously energizes shorting transistor 32 and cross-coupling transistors 9 and 11. The initial levels of conductivity in driver transistors 12 and 13 are retained by the charge stored on the intrinsic capacitors 22 and 23. Immediately thereafter, however, the cross-coupled voltages, with an unbalance of one volt, begin to distinctly affect transistors 12 and 13. Recalling the symmetry in the active and passive circuit elements, one recognizes that the additional volt on terminal $V_1$ drives transistor 13 greater than transistor 12. Since voltage $V_2$ is lower in absolute magnitude to begin with, the regeneration immediately following time $t_2$ pulls node $V_2$ to ground potential as $V_1$ is elevated to a level approaching $V_{DD}$.

To briefly summarize the operative events in time proximity to $t_2$, note that in the time preceding $t_2$ slightly unequal voltages are compared, amplified and stored as asymmetric initial conditions on passive circuit elements. Thereafter, reversion to the bistable multivibrator configuration combines circuit symmetry and regenerative dynamics to allow a nominal difference in initial conditions to drive the circuit to one of two stable states.

The LATCH MODE terminates with time $t_3$. As embodied, and shown in the plots of FIG. 2, the onset of the PRECHARGE MODE coincides with the end of the LATCH MODE. If precharging commences prior to $t_3$, the sampling period would merely be shortened accordingly. Were it to commence after time $t_3$, however, the circuit would temporarily revert to the DIFFERENTIAL MODE for the interim therebetween.

The voltage plots of the embodying circuit show that the MEMORY COLUMN line and the REFERENCE line signals fall to ground potential at time $t_4$. Since the entry of these signals into the circuit is controlled by a signal inverse to the LATCH line signal, coupled to transistors 6 and 7, the MEMORY COLUMN and REFERENCE signals may remain at all times without affecting circuit operation.

Reflecting back upon the description of the circuit elements and their combined operative characteristics, it becomes apparent that speed and consistent level differentiation comprises inherent attributes of the present invention. Furthermore, the timing sequence shown and described clearly evinces the degree of synchronism necessary without imposing onerous burdens, such as transistor gain, input signal level restrictions or response time constraints, on internal devices and external data. With a recognition of these attributes at hand, alternative arrangements of the embodiment by those skilled in the art are feasible without departing from the scope and spirit of the claimed invention.

We claim:
1. A comparator circuit, comprising:
 a multivibrator of substantially symmetric organization having first and second conductive paths, each path containing series connected load and amplification elements joined through an intermediate node;
 a first means, for selectively coupling said node in said first path with said amplification element in said second path;
 a second means, for selectively coupling said node in said second path with said amplification element in said first path;
 a third means, for selectively coupling first and second input signals to said amplification elements in said first and second paths;
 selectively operable means for biasing the operating voltages of said amplification elements into operative correspondence with said first and second input signal voltages; and control means, operatively coupled to said first means, said second means, said third means and said selectively operable means for biasing, for decoupling said first and second means concurrent with the coupling of said third means and an operation of said means for biasing, and for coupling said first and second means concurrent with a disabling of said means for biasing in timed sequence thereafter.

2. The circuit recited in claim 1, further comprising:

output amplification elements of substantially equal load impedance coupled to each of said nodes;

means for effecting a decoupling of said third means concurrent with a coupling of said first and second means; and means for disabling said output amplification elements for an interval of time coincident with a decoupling of said first and second means.

3. The circuit recited in claim 2, wherein:

said load elements are comprised of substantially identical booted load circuits; and said circuit further includes means for precharging each of said booted load circuits, coupled between said two booted load circuits and a source of precharge potential.

4. The circuit recited in claim 3, wherein:

said selectively operable means for biasing comprises a constant current source, coupled between a source of potential and a common connection of said first and second conductive paths, and has in electrical parallel therewith a selectively operable switch for shorting said constant current source.

5. The circuits recited in claim 1, 2, 3 or 4, wherein:

said amplification elements, load elements, means for selectively coupling and means for biasing are fabricated as integrated circuits with field effect type transistors; and supplemental impedance loading is electrically coupled to each of said nodes in the amount necessary to substantially balance the impedance loads at each of said nodes.

6. A method of operating a symmetrically organized comparator circuit, to distinguish between two input signals of similar magnitude and generate a binary form output signal, comprising the steps of:

operating said circuit in a differential mode;

biasing the amplification elements of said circuit into operable correspondence with the levels of the input signals;

disabling the bias applied to the amplification elements in substantial time correspondence with a transition of the circuit from a differential mode to a latch mode; and maintaining impedance symmetry during the dynamics of the transition between the differential mode and the latch mode.

7. The method recited in claim 6, wherein the transition of the comparator circuit from a differential mode to the latch mode is performed by cross-coupling symmetric paths in a bistable multivibrator segment of said comparator circuit.

8. The method recited in claim 7, further comprising the step of decoupling said input signals in time correspondence with the transition between the differential mode and the latch mode.

9. The methods recited in claim 6, 7 or 8, including the further step of precharging said comparator circuit prior to commencing the differential operating mode.

* * * * *